(12) United States Patent
Kim et al.

(10) Patent No.: US 8,871,614 B2
(45) Date of Patent: Oct. 28, 2014

(54) SEMICONDUCTOR DIE WITH PROTECTIVE LAYER AND RELATED METHOD OF PROCESSING A SEMICONDUCTOR WAFER

(75) Inventors: Sun-joon Kim, Yongin-si (KR); Hyeoung-won Seo, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 429 days.

(21) Appl. No.: 12/961,795

(22) Filed: Dec. 7, 2010

(65) Prior Publication Data

US 2011/0076856 A1 Mar. 31, 2011

Related U.S. Application Data

(62) Division of application No. 11/846,749, filed on Aug. 29, 2007, now Pat. No. 7,867,825, which is a division of application No. 11/235,320, filed on Sep. 27, 2005, now Pat. No. 7,279,775.

(30) Foreign Application Priority Data

Sep. 30, 2004 (KR) .................... 10-2004-0077733

(51) Int. Cl.
*H01L 21/78* (2006.01)
*H01L 23/31* (2006.01)
*H01L 23/00* (2006.01)

(52) U.S. Cl.
CPC ............ *H01L 23/3178* (2013.01); *H01L 23/562* (2013.01); *H01L 2924/12044* (2013.01); *H01L 23/3192* (2013.01); *H01L 2924/0002* (2013.01)
USPC ............................. 438/465; 438/113; 438/114

(58) Field of Classification Search
USPC .................................. 438/113, 114, 450, 465
See application file for complete search history.

(56) References Cited

U.S. PATENT DOCUMENTS

| | | | | |
|---|---|---|---|---|
| 4,179,794 A | * | 12/1979 | Kosugi et al. | 438/465 |
| 5,017,512 A | * | 5/1991 | Takagi | 438/462 |
| 6,538,301 B1 | | 3/2003 | Yamada et al. | |
| 6,566,735 B1 | | 5/2003 | Minn et al. | |
| 2003/0162369 A1 | * | 8/2003 | Kobayashi | 438/465 |
| 2003/0193090 A1 | | 10/2003 | Otani et al. | |
| 2004/0238926 A1 | * | 12/2004 | Obinata | 257/678 |
| 2005/0048740 A1 | * | 3/2005 | Noma et al. | 438/460 |
| 2005/0269702 A1 | | 12/2005 | Otsuka | |

FOREIGN PATENT DOCUMENTS

| | | |
|---|---|---|
| JP | 58-017621 | 2/1983 |
| JP | 00122737 A | 7/1983 |
| JP | 01-315163 | 12/1989 |
| JP | 05-226325 | 9/1993 |
| JP | 06151584 A | 5/1994 |
| JP | 00264489 A | 10/1996 |
| JP | 09-148436 | 6/1997 |
| JP | 2000-232105 | 8/2000 |
| JP | 2001-291715 | 10/2001 |
| WO | 2004097916 A1 | 11/2004 |

OTHER PUBLICATIONS

Japanese Patent Office dated Oct. 18, 2011.

* cited by examiner

*Primary Examiner* — Thanhha Pham
(74) *Attorney, Agent, or Firm* — Volentine & Whitt, PLLC

(57) ABSTRACT

A semiconductor die and a related method of processing a semiconductor wafer are disclosed in which a first interlayer insulator having a recess region of varying configuration and defining a scribe line is associated with at least one protective layer formed with a characterizing inclined side surface.

3 Claims, 8 Drawing Sheets

SEMICONDUCTOR DIE WITH PROTECTIVE LAYER AND RELATED METHOD OF PROCESSING A SEMICONDUCTOR WAFER

CROSS-REFERENCE TO RELATED APPLICATIONS

This is a divisional of application Ser. No. 11/846,749, filed Aug. 29, 2007, which is a divisional of application Ser. No. 11/235,320, filed Sep. 27, 2005, now U.S. Pat. No. 7,279,775, which claims priority to Korean Patent Application No. 10-2004-0077733 filed Sep. 30, 2004, the collective subject matters of which are incorporated herein by reference in their entirety.

BACKGROUND OF THE INVENTION

1. Field of the Invention

The invention relates generally to semiconductor devices, semiconductor dies, and a related method of processing a semiconductor wafer. More particularly, the invention relates to a semiconductor die incorporating one or more protective layer(s) having improved step coverage amongst other benefits. The invention also relates to a method of processing a semiconductor wafer to manufacture the semiconductor die incorporating the improved protective layer.

2. Description of the Related Art

Contemporary semiconductor manufacturing processes typically produce multiple integrated circuit chips (or dies) on a single semiconductor wafer. The peripheral boundaries separating individual dies are marked or defined by scribe lines formed (e.g., inscribed) in the surface of the semiconductor wafer. Scribe lines have many useful purposes. For example, once the complicated sequence of processing steps forming the plurality of dies is complete, individual die, or groups of die, may be accurately cut from the semiconductor wafer using a diamond-tipped cutter that follows a path defined by scribe lines.

Consider, for example, the partial view of a conventional semiconductor die shown in FIG. 1. Of note, the conventional die includes a protective layer covering (or intended to cover) peripheral portions of a substrate and multi-layer structure formed on the substrate as part of the conventional die. A scribe line (SL) is located in the recess region.

The conventional die shown in FIG. 1 shows two exemplary multilayer structures, each comprising a conductive line 18 electrically connected to a conductive region 12 formed on substrate 10. (Throughout this description the term "on" is used to describe a spatial relationship between layers, components and/or elements. The term "on" may be used to describe a relationship where "A is directly on B," or a relationship where "A is on B," but one or more intervening layers, components and/or elements separate A from B. See, e.g., the relationship between conductive line 18 and substrate 10).

The multilayer structures shown in FIG. 1 are separated by the scribe line (SL). Conductive line 18 is connected to conductive region 12 via a contact plug 16 formed in a first interlayer insulator 14. A protective layer 22 is formed over the multilayer structure to cover an upper surface of a second interlayer insulator 20 formed on conductive line 18, as well as the side surfaces of first and second interlayer insulators 14 and 20.

In this manner the constituent parts of the multilayer structures are intended to be protected by protective layer 22 from the potentially harmful effects of the ambient environment. For example, protective layer 22 absorbs impacts likely to occur during subsequent processing of the semiconductor wafer containing the individual die. Packaging processes are an excellent example of these subsequent processes.

In order to optimize its impact-absorbing an other protective qualities associated with protective layer 22, the layer must remain firmly attached (adhered) to the upper surface of second interlayer insulator 20, the side surfaces of the first and second interlayer insulators 14 and 20, and at least some portion of the upper surface of substrate 10 around the scribe line (SL). Unfortunately, the large and steep step formed by the side surfaces of first interlayer insulator 14 and second interlayer insulator 20, make adhesion by protective layer 22 difficult. This problem is particularly pronounced at the intersections of horizontal and vertical surfaces. Note the lifting phenomenon indicated in section "a" of FIG. 1. Note also the uncovered, upper corner portion of second interlayer insulator 20 indicated in section "b" of FIG. 1.

When coverage by protective layer 22 is incomplete, impacts occurring during subsequent processing may cause cracking or fracture of fragile portions of the multi-layer structures formed on substrate 10. For example, when inadequate coverage by protective layer 22 results in a diminished impact-absorbing capacity, first interlayer insulator 14 and/or second interlayer insulator 20 may crack during attachment of a lead frame to the semiconductor die. The exposed edge corner of second interlayer insulator 20 is particularly susceptible to impact damage.

Additionally, when protective layer 22 begins to lift or otherwise becomes separated from the underlying layers of the multiplayer structure, chemicals, moisture, or other contaminates may infiltrate the multilayer structure during subsequent processing, such as a KOH reliability measurement, a pressure cooker test, etc.

As a result of the these potentially detrimental effects, the improved adhesion and step coverage of protective layer 22 has been the subject of significant research. For example, U.S. Pat. No. 5,300,816 is directed to a method of improving the step coverage for a similar protective layer.

FIG. 2 generally illustrates one embodiment of the method described in U.S. Pat. No. 5,300,816. Referring to FIG. 2, a multilayer structure (MS) is formed on a semiconductor substrate 50 having a device isolation layer 52. A scribe line (SL) separates adjacent multilayer structures. Each multilayer structure (MS) comprises five layers consecutively numbered in the figure as 61 through 65 with the bottommost layer being designated 61 and the uppermost layer being designated 65. In the illustrated example, individual layers 61, 63, and 65 are conductive layers, and individual layers 62 and 64 are insulators.

Note that each successively lower layer extends laterally towards the periphery of the multilayer structure by a greater distance. In this manner, each one of individual layers 61 through 65 is a bit longer than the layers disposed above it. Thus, the length of insulating layer 64 is a distance L2 longer than the length L1 of conductive layer 65. As a result, the edge portion of the multilayer structure (MS) formed by the combination the individual layers 61 through 65 takes on the form of a stepped incline, rather than the steep vertical drop shown in FIG. 1. This stepped incline allows improved protection layer coverage.

Unfortunately, the manufacturing process adapted to produce the multilayer structure (MS) illustrated in FIG. 2 is overly complex due to the multiple deposition and photolithography processes required to form the plurality of individual layers of varying length. This is particularly true where alignment (or other spatial relationships) between conductive layers 61, 63, and 65 and insulators 62 and 64 must be precisely controlled. Of further note, the multilayer structure (MS) illustrated in FIG. 2 contributes to an undesirable increase in overall die size.

SUMMARY OF THE INVENTION

The present invention provides a semiconductor die having a protective layer with improved protective qualities and a related manufacturing method for processing a semiconductor wafer.

In one embodiment, the invention provides a semiconductor die, comprising; a first interlayer insulator having a principal surface and a recess region containing a scribe line, a second interlayer insulator formed on the first insulator layer, a principal conductive line characterized by an inclined side surface and formed on the first and second interlayer insulators, and a protective layer formed on the inclined side surface of the principal conductive line and at least a sidewall portion of the recess region of the first interlayer insulator.

The recess region generally defines the scribe line which preferably remains uncovered by the protective layer. In one related aspect, the recess region has a width defining the scribe line.

In another aspect, the inclined side surface of the principal conductive line defines an angle of inclination with respect to the principal surface of the first interlayer insulator ranging from about 40° to about 80°. With one or more of the foregoing features, a bottom surface of the resulting protective layer will strongly adhere to an upper surface of the recess region of the first interlayer insulator.

In another embodiment, the invention provides a semiconductor die, comprising; a first interlayer insulator having a principal surface and a first recess region defining a scribe line, a first conductive line formed on the principal surface of the first interlayer insulator, a second interlayer insulator formed on the first interlayer insulator and partially covering the first conductive line to define an exposed side surface and an exposed upper surface portion of the first conductive line, a second conductive line characterized by an inclined side surface and formed on the exposed side surface and exposed upper surface portion of the first conductive line first, a first protective layer formed on the inclined side surface of the second conductive line, and a second protective layer formed on the first protective layer and on at least a side surface of the first recess region, whereby a bottom surface of the second protective layer strongly adheres to an upper surface of the first recess region.

In related possible aspects, the first interlayer insulator may comprise a silicon oxide layer. The first conductive line may comprise one selected from a group consisting of at least Al, Cu, W, and Mo, metal alloys comprising at Al, Cu, W, and Mo, and metal nitrides comprising at least Al, Cu, W, and Mo.

Other possible aspects potentially related to one or more embodiments of the invention include the following. The inclined side surface of the second conductive line may be characterized by the width and height of the second conductive line. The width of the second conductive line may be defined in relation to a horizontal distance between the side surface of the second interlayer insulator and the exposed side surface of the first conductive line. The height of the second conducting line may be measured from the bottom surface of the first recess region to an upper most portion of the second conductive line and subsume at least a height of the exposed side surface of the first conducting line, and a height of the side surface of the second interlayer insulator. The width of the exposed upper surface portion of the first conducting line may define at least in part the width of the second conductive line. The second conductive line may also cover a side surface associated with a recess in the first interlayer insulator near the exposed side surface of the first conductive line. The first protective layer may comprise a silicon oxide layer and/or a silicon nitride layer. The silicon oxide layer may be formed of a high density plasma (HDP) oxide layer. The second protective layer may comprise a thermosetting polymer resin or a photosensitive polyimide resin, either ranging in thickness from about 2 µm to about 20 µm.

In yet another embodiment, the invention provides a semiconductor die, comprising; a first interlayer insulator having a principal surface, a first recess region and a second recess region, wherein the first recess region contains a scribe line, and wherein the second recess region is formed with a width greater than a width associated with the first recess region and a depth less than a depth associated with the first recess region, a first conductive line formed on the principal surface of the first interlayer insulator, a second interlayer insulator formed on the first interlayer insulator and partially covering the first conductive line to define an exposed side surface and an exposed upper surface portion of the first conductive line, a second conductive line characterized by an inclined side surface and formed on the exposed side surface and exposed upper surface portion of the first conductive line first, a first protective layer formed on the inclined side surface of the second conductive line, and a second protective layer formed on the first protective layer and on at least a side surface of the first recess region and a side portion of the second recess region, whereby a bottom surface of the second protective layer strongly adheres to an upper surface of the first recess region.

In still another embodiment, the invention provides a semiconductor die comprising; a first interlayer insulator having a principal surface, a plurality of recess regions proximate a scribe line, a first conductive line formed on the principal surface of the first interlayer insulator, a second interlayer insulator formed on the first interlayer insulator and partially covering the first conductive line to define an exposed side surface and an exposed upper surface portion of the first conductive line, a second conductive line characterized by an inclined side surface and formed on the exposed side surface and exposed upper surface portion of the first conductive line first, a first protective layer formed on the inclined side surface of the second conductive line, and a second protective layer formed on the first protective layer and filling at least one of the plurality of recess regions, whereby a bottom surface of the second protective layer strongly adheres to an upper surface of the first recess region.

In still another embodiment, the invention provides a method of manufacturing a semiconductor wafer, the method comprising; forming a first interlayer insulator, forming a first conductive line by patterning a first conductive line material layer formed on the first interlayer insulator, patterning a second interlayer insulator formed on the first conductive line to expose an upper surface portion and a side surface of the first conductive line, forming a second conductive line characterized by an inclined side surface on the exposed upper surface portion and side surface of the first conductive line, forming a first protective layer on the second conducting line, forming a first recess region in the first interlayer insulator using first and second etching processes, wherein the first etching process is adapted to form a fuse window using the first protective layer as an etch mask and the second etching process exposes a bonding pad, and forming a second protective layer covering the inclined side surface of the first protective layer and at least a side surface of the first recess region.

In still another embodiment, the invention provides a method of manufacturing a semiconductor wafer, the method comprising; forming a first interlayer insulator, forming a first conductive line by patterning a first conductive line material layer formed on the first interlayer insulator, patterning a second interlayer insulator formed on the first conductive line to expose an upper surface portion and a side surface of the first conductive line, forming a second conductive line characterized by an inclined side surface on the exposed upper surface portion and side surface of the first conductive line, forming a first protective layer on the second conducting line, forming a first recess region to a first depth and with a first width in the first interlayer insulator, forming a second recess region on the first recess region with a second width greater than the first width and a second depth less than the first depth using first and second etching processes, wherein the first etching process is adapted to form a fuse window using the first protective layer as an etch mask and the second etching process exposes a bonding pad, and forming a second protective layer on the inclined side surface of the first protective layer, side and bottom surfaces of the second recess region, and at least a side surface of the first recess region.

In still another embodiment, the invention provides a method of manufacturing a semiconductor wafer, the method comprising; forming a first interlayer insulator, forming a first conductive line by patterning a first conductive line material layer formed on the first interlayer insulator, patterning a second interlayer insulator formed on the first conductive line to expose an upper surface portion and a side surface of the first conductive line, forming a second conductive line characterized by an inclined side surface on a side surface of the second interlayer insulator and the exposed upper surface portion and side surface of the first conductive line, forming a first protective layer on the second conducting line, forming a plurality of recess regions in the first interlayer insulator using first and second etching processes, wherein the first etching process is adapted to form a fuse window using the first protective layer as an etch mask and the second etching process exposes a bonding pad, forming a scribe line in relation to the plurality of recess regions, and forming a second protective layer covering the inclined side surface of the first protective layer and filling at least one of the plurality of recess regions.

In still another embodiment, the invention provides a method of manufacturing a semiconductor wafer, the method comprising; defining a scribe line separating individual semiconductor die on the semiconductor wafer, wherein one semiconductor die comprises a multi-layer structure formed on a principal surface, forming a recess region in the principal surface adjacent to the multi-layer structure, and forming at least one protective layer having an arced inclined surface to cover the multi-layer structure, wherein a bottom surface of the at least one protective layer adheres to at least one surface of the recess region.

BRIEF DESCRIPTION OF THE DRAWINGS

The above and other features and advantages of the invention will become more apparent upon consideration of several exemplary embodiments described below with reference to the attached drawings in which.

DESCRIPTION OF EXEMPLARY EMBODIMENTS

The invention will now be described with reference to the accompanying drawings in relation to several exemplary embodiments. These embodiments are selected teaching examples. The invention may be variously embodied in many different forms and should not be construed as being limited to only the embodiments described herein.

A first exemplary embodiment of the invention is illustrated in relation to the sectional-views shown in FIGS. 3 through 11. These figures taken separately or collectively illustrate different aspects of a semiconductor die incorporating an improved protective layer and a related method of processing a semiconductor wafer according to one generalized embodiment of the invention.

Figure 1:
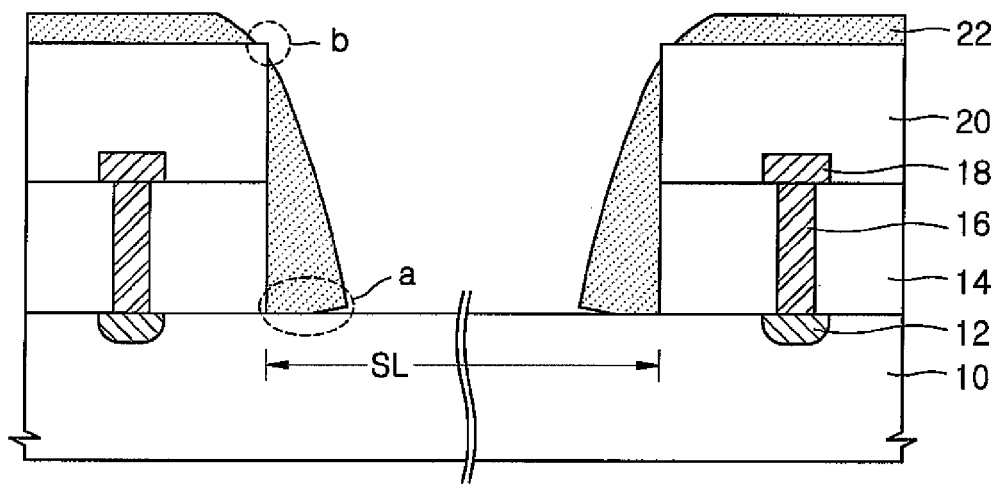
FIG. 1 is a sectional-view of a conventional semiconductor die covered by a protective layer.
Figure 2:
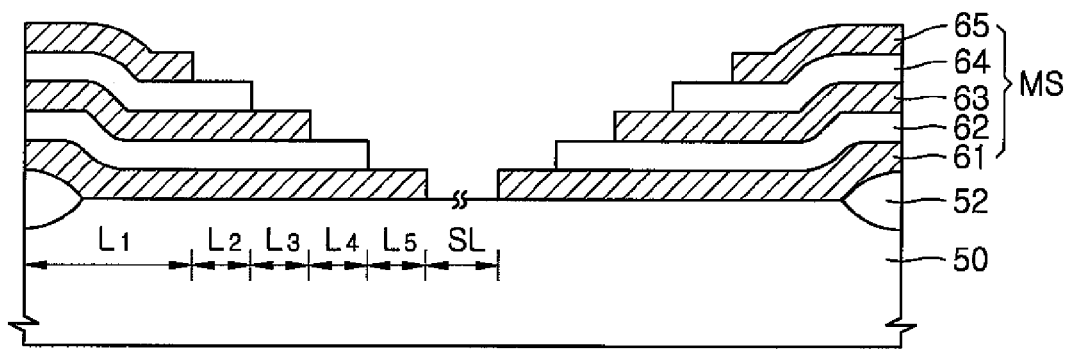
FIG. 2 is a view illustrating a method of forming a protective layer with improving step coverage according to an embodiment disclosed in U.S. Pat. No. 5,300,816.
Figure 3:
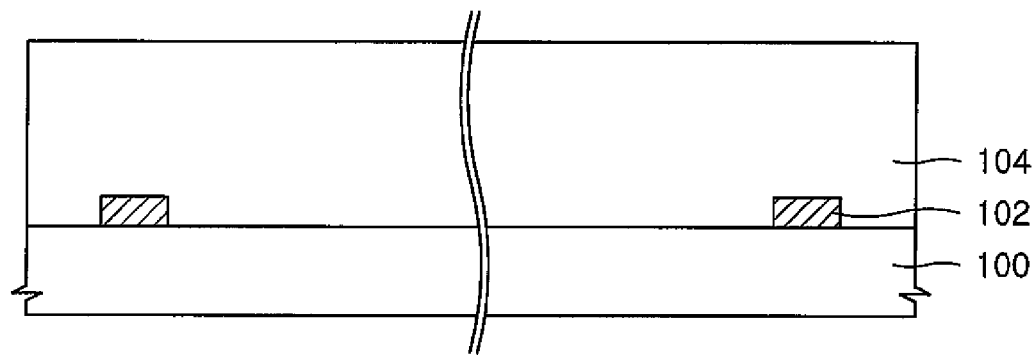
FIGS. 3 through 11 are sectional-views illustrating a semiconductor die with an improved protective layer and related method of manufacturing a semiconductor wafer according to one embodiment of the invention.

Referring to FIG. 3, a conductive region 102 is formed on a substrate 100. Substrate 100 may be a semiconductor wafer, or a semiconductor wafer comprising one or more multilayer structures (not shown). An exposed surface of substrate 100 and conductive region 102 are covered by a first interlayer insulator 104 having a principal surface. First interlayer insulator 104 may be, for example, a silicon oxide layer.

Figure 4:
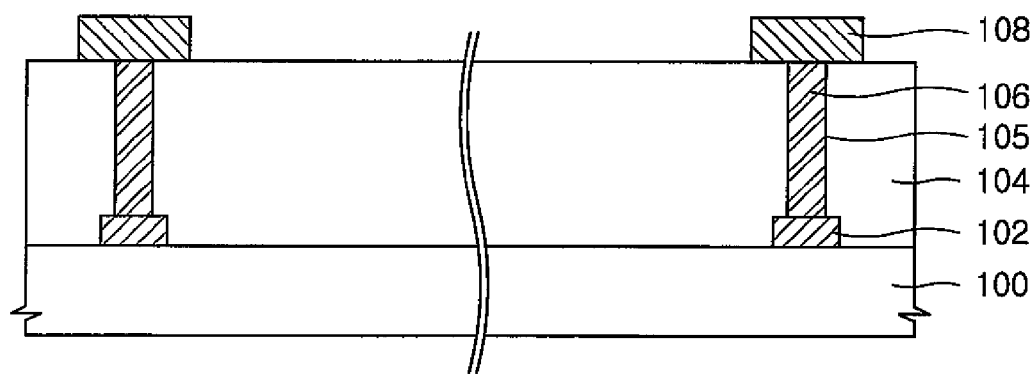

Referring to FIG. 4, a contact hole 105 is formed through first interlayer insulator 104 to expose conductive region 102. Contact hole 105 is then filled to form a contact plug 106. Contact plug 106 is then planarized to have the same level as an upper surface of first interlayer insulator 104. A first conductive line material layer (not shown) may then be formed on planarized contact plug 106 and first interlayer insulator 104, such that the first conductive line material layer is electrically connected to conductive region 102. The first conductive line material is etched using a photolithograpy process, for example, to form a first conductive line 108. First (or subordinated) conductive line 108 may be formed from one or more metals or metal alloys or metal nitrides selected from a group including at least Al, Cu, W, Mo, and/or Ti-nitride, Ta-nitride and/or W-nitride. The width and height of first conductive line 108 may be determined in relation to the shape and inclination of a second conductive line (120a in FIG. 8) to be formed in a subsequent process. In one possible aspect, first conductive line 108 may be formed on first interlayer insulator 104 using a damascene process.

Figure 5:
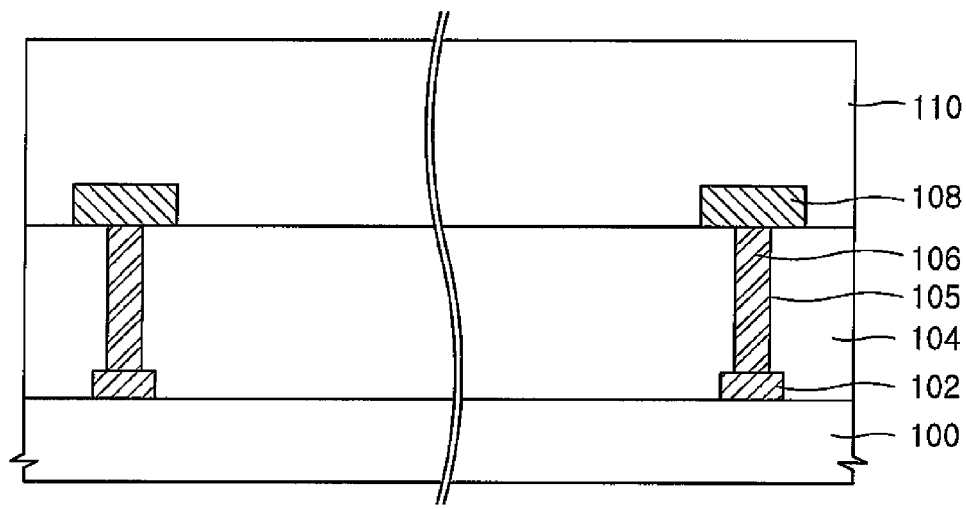

Referring to FIG. 5, a second interlayer insulator 110 covering first conductive line 108 is formed on the exposed surface of first interlayer insulator 104 to cover first conductive line 108. Second interlayer insulator 110 may be formed, for example, from a silicon oxide. The depth (or thickness) of second interlayer insulator 110 is determined in relation to the shape and inclination of second conductive line 120a shown in FIG. 8.

Figure 6:
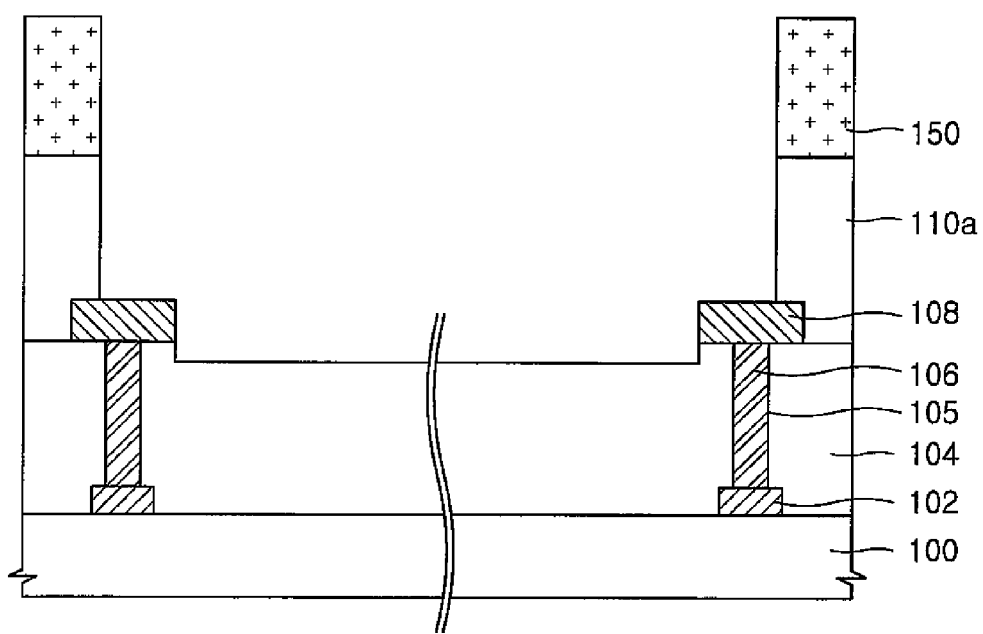

Referring to FIG. 6, a first photoresist pattern 150 exposing a selected portion of first conductive line 108 is formed on second interlayer insulator 110. Then, portions of second interlayer insulator 110 are selectively using the first photoresist pattern 150 as a pattern. Patterned second interlayer insulator 110a results and allows exposure of one side surface as well as a portion of the upper surface of first conductive line 108. During this process step, a portion of first interlayer insulating layer 104 near the exposed side surface of first conductive line 108 may be recessed down to a predetermined depth by over-etching of the second interlayer insulator 110. That is, a portion first interlayer insulator 104 underlying the removed portion of second interlayer 110 beyond the exposed side surface of first conductive line 108 is removed down to a predetermined depth to form a recessed upper surface portion of first interlayer insulator 104. The selected portion of second interlayer insulator 110 and underlying portion of first interlayer insulator 104 may be removed, for example, with a process using diluted HF, NH4F, or a buffered oxide etchant, such as a liquid mixture of HF and deionized water.

Figure 7:
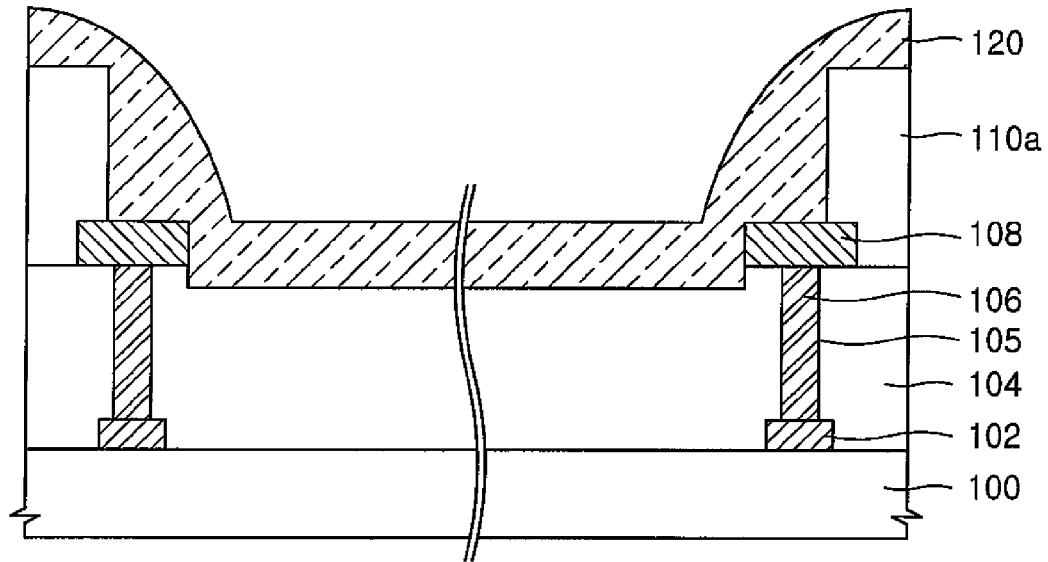

Referring to FIG. 7, the remaining portion of first photoresist pattern 150 is removed using one of several conventional methods. For example, the residual portion of first photoresist pattern 150 may be removed with an ashing process applying oxygen plasma followed by organic stripping.

Afterwards, a second conductive line material layer 120 is deposited to cover first conductive line 108 including the exposed side wall portion down to the recessed surface of first interlayer insulator 104, as well as second interlayer insulator pattern 110a. Second conductive line material layer 120 may be formed from of one or more metals or metal alloys selected from a group comprising at least Al, Cu, W, Mo, and/or a conductive metal nitride such as Ti-nitride, Ta-nitride, and/or W-nitride.

Figure 8:
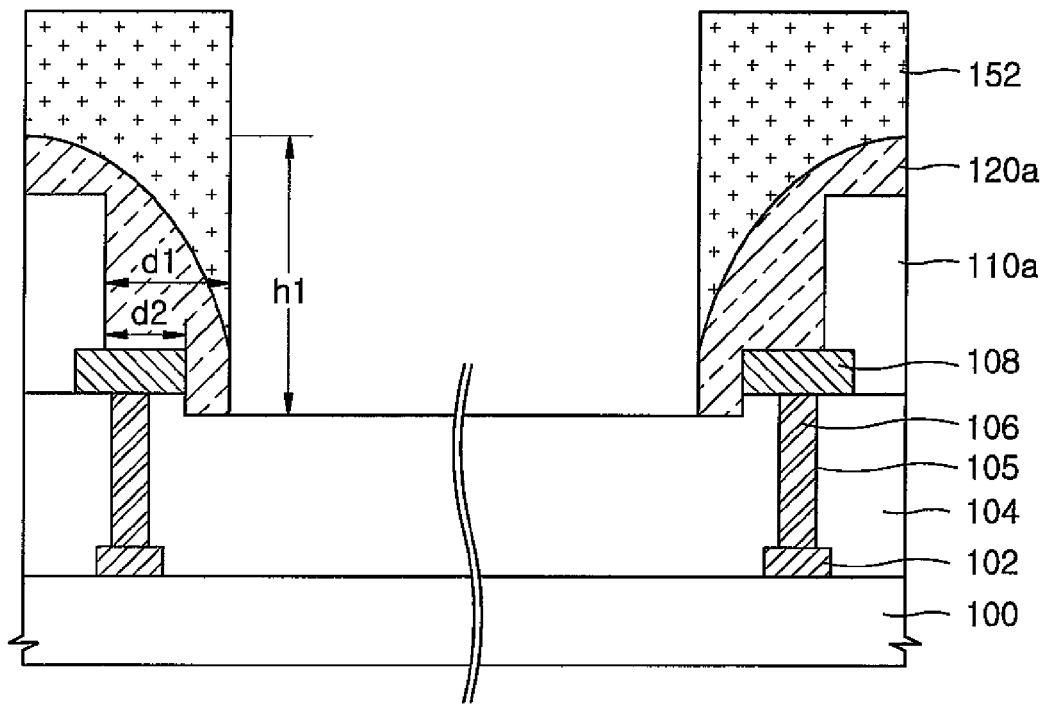

Referring to FIG. 8, a second photoresist pattern 152 defining a second (or principal) conductive line 120a is formed on the second conductive line material layer 120. Then, second conductive line material layer 120 is aniostropically etched, for example, using second photoresist pattern 152 as an etch mask to form the second conductive line 120a. The preferred method of anisotropically etching second conductive line material layer 120 may be performed using a plasma etching process or a reactive ion etching process, as examples. During the anisotropic etching of second conductive line material layer 120, first interlayer insulator 104 functions as an etch stopper. The resulting second conductive line 120a covers the previously exposed side surface of first conductive line 108, the recess side of first interlayer insulator 104, and sidewall and upper surface portions of second interlayer insulator pattern 110a. In the illustrated example, second conductive line 120a takes on the well known shape of a sidewall spacer; that is one having an arced inclined surface. Second conducting line 120a is electrically connected to conductive region 102 through first conductive line 108.

The arced inclined surface of second conductive line 120a may be characterized by a width "d1" and a height "h1." Width "d1" for second conductive line 120a is measured horizontally from a sidewall surface of second interlayer insulator pattern 110a to the lateral extent of the arced inclined surface of second conductive line 120a. Of note, width "d1" is determined in large part by the width "d2" of the exposed upper surface portion of first conductive line 108. Height "h1" of second conducting line 120a is measured from the recess bottom of first interlayer insulator 104 to the uppermost surface point of second conductive line 120a, and is at least high enough to cover the exposed side portion of first conductive line 108 and the overlaying sidewall and surface portions of second interlayer insulator pattern 110a.

An inclination angle associated of second conducting line 120a may be defined as the angle formed between the intersection the recessed bottom surface of first interlayer insulator 104 and the arced inclined surface of second conductive line 120a. This inclination angle may range from 40° to 80°.

As presently contemplated, an inclination angle less than 40° will result in an undesirable increase in the overall size of the incorporating die. On the other hand, an inclination angle greater than 80° becomes so steep that the step coverage benefits sought by the invention begin to deteriorate. Of further note in relation to analogous conventional structures, the bottom surface of second conducting line 120a is strongly adhered to the upper surface of recessed first interlayer insulator 104.

Figure 9:
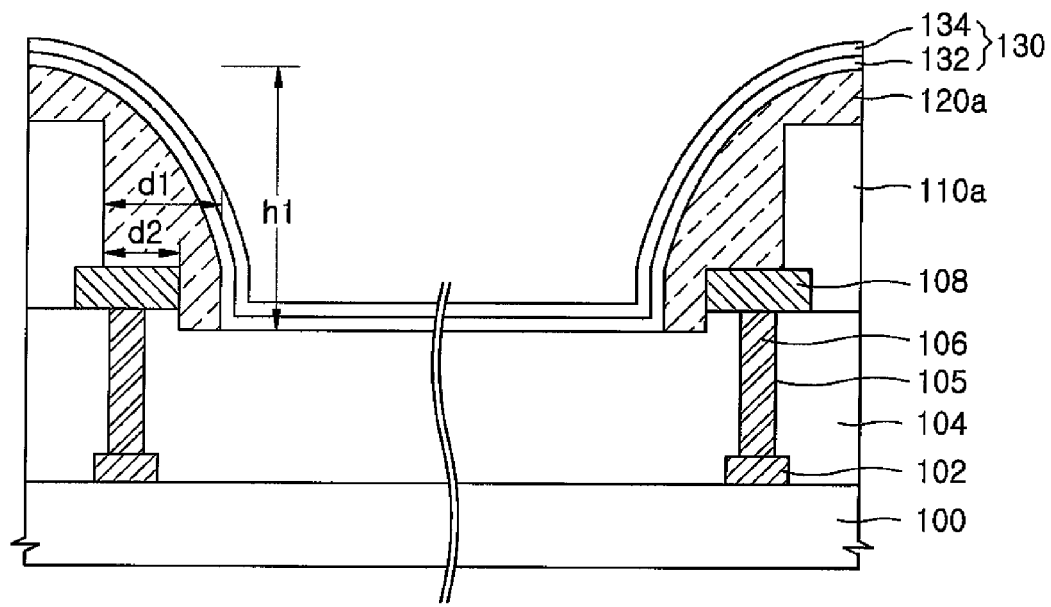

Referring to FIG. 9, the residual portions of second photoresist pattern 152 are removed using one of several conventionally available methods. For example, the residual portions of second photoresist pattern 150 may be removed using an ashing process applying an oxygen plasma and subsequent organic stripping.

Afterwards, a first protective material layer 130 is deposited on the combination of second conducting line 120a and first interlayer insulator 104. First protective material layer 130 may be formed from a single layer (e.g., silicon oxide or nitride) or a compound set of layers, such as a silicon oxide layer 132 and a silicon nitride layer 134. In the illustrated example, silicon oxide layer 132 may be deposited using a high density plasma (HDP) chemical vapor deposition (CVD) to obtain high quality protective material layer.

HDP CVD is a combination process involving CVD and sputtering. For example, a sputtering gas capable of etching a deposited material layer, as well as a deposition gas used to deposit the material layer are both provided to a reaction chamber. For example, a combination of SiH4 and O2 may be used the deposition gas, and Ar or some other inert gas may be used as the sputtering gas. The deposition gas and sputtering gas are partly ionized by a plasma field within the reaction chamber. The plasma may be generated using high frequency power as is known in the art.

The deposition process may be further accelerated by applying a biased radio frequency (RF) power signal to the working substrate within the reaction chamber. For example, the biased RF power signal may be applied to a wafer chuck (e.g. an electrostatic chuck) holding substrate 100 within the reaction chamber. With application of the biased RF power signal the ionized deposition and sputtering gases are accelerated towards the surface of substrate 100. Accelerated deposition gas ions and sputtering gas ions form in combination silicon oxide layer 132. As formed by the foregoing HDP CVD process, silicon oxide layer 132 is a very high quality layer characterized by high density and excellent gap-filling abilities.

Silicon nitride layer 134 prevents silicon oxide layer 132 from being oxidized during subsequent processing, and improves the insulating and waterproofing characteristics of a first protective material layer 130.

Figure 10:
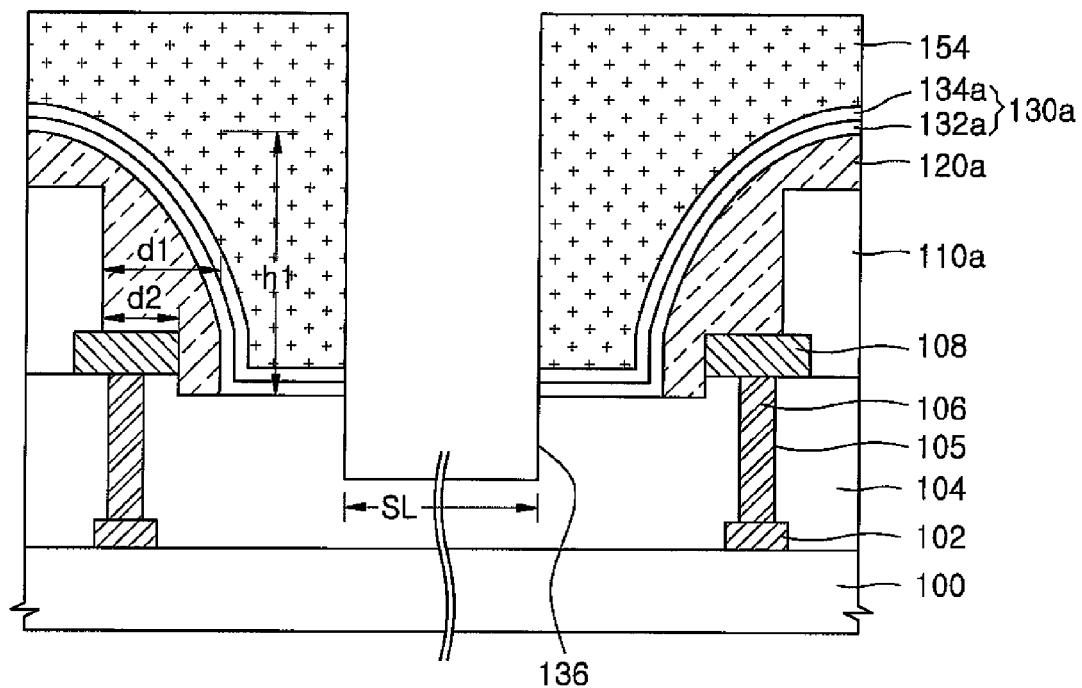

Referring to FIG. 10, a third photoresist pattern 154 defining scribe line (SL) is formed on the first protective material layer 130. Then, first protective material layer 130 and first interlayer insulator 104 are sequentially etched using third photoresist pattern 154. Silicon nitride layer 134 may be removed, for example, using a phosphoric acid. Silicon oxide layer 132 and first interlayer insulator 104 may be removed, for example, using a diluted HF, NH4F, or a buffered oxide etchant, such as a liquid mixture of HF and deionized water.

These layers are selectively etched to form a first recess region 136 defining the scribe line (SL) down through at least some portion of first interlayer insulator 104. First recess region 136 is formed with a flat bottom surface and a sidewallto-sidewall width related to the scribe line (SL). That is, the scribe line (SL) will be apparent within the width of first recess region 136. As thus patterned, first protective material layer 130 becomes first protective layer pattern 130a, comprising selectively etched portions of silicon oxide layer 132a and/or silicon nitride layer 134a in the illustrated embodiment.

The etching process used to form first recess region 136 may comprise a conventional combination of a first etching process and second etching process. The first etching process is may be used to coincidentally form a fuse window (not shown) for fusing a wire, a solderball, or the like. The second etching process may be used to coincidentally expose a bonding pad (not shown). The fuse window formation and bonding pad exposure have utility in relation to the formation of other conventional components (not shown) commonly related to the multi-layer structures illustrated the working examples.

Figure 11:
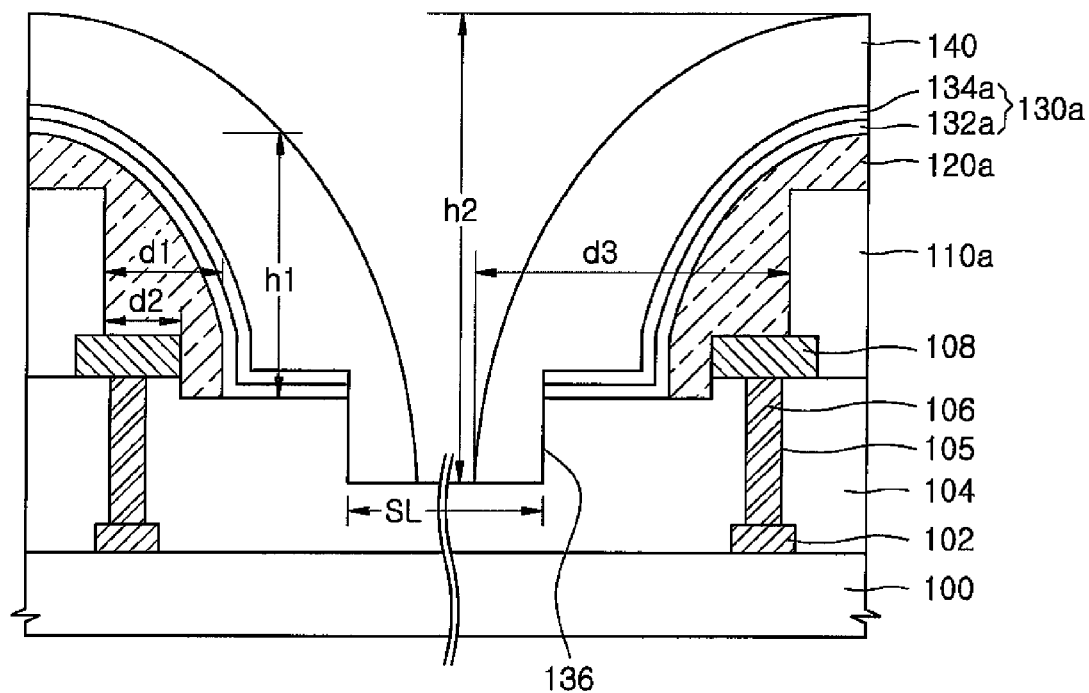

Referring to FIG. 11, after removing third photoresist pattern 150, a second protective layer 140 is formed on first protecting layer pattern 130a and potentially on some portion of the bottom surface of first recess region 136 containing the scribe line (SL). For example, second protective layer 140 will typically cover the upper and side surfaces of first protective layer pattern 130a, side surfaces of first recess region 136, and some portion of the bottom surface of first recess region 136. However, the scribe line (SL) which is not covered by second protective layer 140, but remains exposed. Second protective layer 140 may be formed, for example, using a conventional spin coating technique. Subsequently, second protective layer 140 may be hardened, where advisable, using a predetermined heat treatment.

As formed, second protective layer 140 covers the upper surface and sidewall surfaces of the multi-layer structure as well as the first protective layer 130a. The side surface inclination of second protective layer 140 may be determined in relation to a height "h2" and width "d3." Height "h2" may be measured from the bottom surface of first recess region 136 to the uppermost point of second protective layer 140, and generally combines the measure of height "h1" associated with second conductive line 120a and the measure of the depth of first recess region 136. Width "d3" may be measured from the farthest lateral extent of second protective layer 140 to the sidewall of second interlayer insulator pattern 110a. Thus, the inclination associated with the side surface of second protective layer 140 may be adjusted by adjustments to width "d1" and height "h1" associated with second conductive line 120a. The inclination of second protective layer 140 may be further determined by adjustments to width "d2" associated with the exposed portion of the upper surface of first conductive line 108 contacting second conductive line 120a. With this structure, the bottom surface of second protective layer 140 strongly adheres to the bottom surface first recess region 136 containing the scribe line (SL).

According to the foregoing embodiment, the side surface of second protective layer 140 is characterized by an arced incline defined in significant part by the shape and dimensions of the underlying arced incline associated with the second conductive line 120a. The arced incline shape of the side surface of second protective layer 140 strongly promotes adhesion of the second protective layer 140 to the first recessed region 136 contain the scribe line (SL). In addition, since the upper corner edge portion of second interlayer insulator pattern 110a is covered by second conductive line 120a, second protective layer 140 may be formed with a highly uniform thickness. The improved adhesion characteristics and uniform thickness of second protective layer 140 enhance protection of the underlying multi-layer structure from the ambient environment (e.g., moisture and infiltrating chemicals) and impact stress. These beneficial results accrue to embodiments of the invention without need to increase the size of the semiconductor die as do some conventional solutions.

In the foregoing embodiment, second protective layer 140 may be formed, for example, from a thermosetting polymer resin, or as presently preferred, a photosensitive polyimide resin. The overall thickness of second protective layer 140 may range from between 2 µm to 20 µm, for example.

Figure 12:
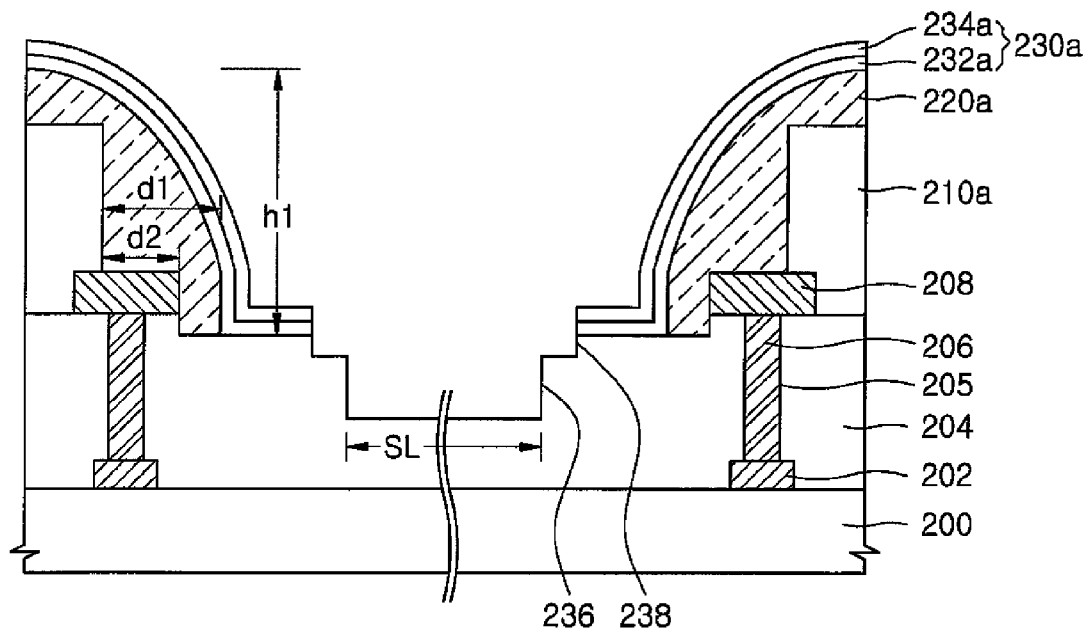
FIGS. 12 and 13 are sectional-views illustrating a semiconductor die with an improved protective layer and related method of manufacturing a semiconductor wafer according to another embodiment of the invention.
Figure 13:
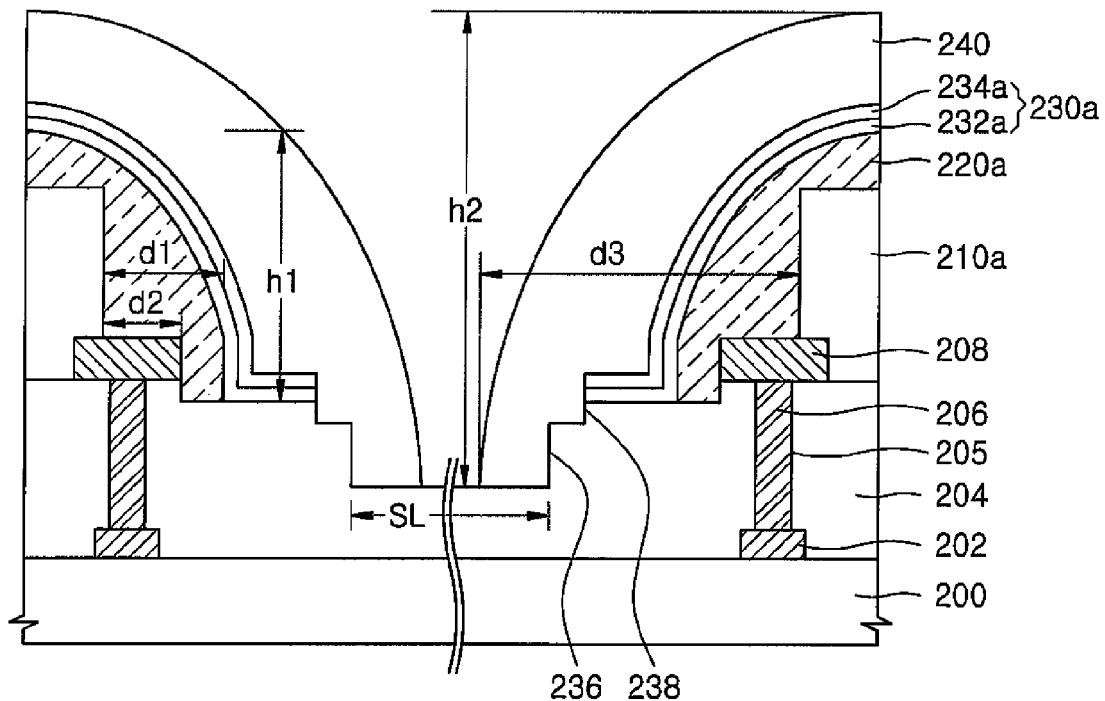

FIGS. 12 and 13 are sectional-views illustrating a method of manufacturing a semiconductor wafer with an improved step coverage according to another embodiment of the invention. In this embodiment, the processing steps associated with the formation of first protective layer pattern 230a on second conductive line 220a and an upper surface portion of first interlayer insulator 204 are assumed to be identical to those described in the foregoing example in relation to analogous layers, components and/or elements.

An inclination associated with a side surface of second conductive line 220a may be determined in relation to width "d1" and height "h1." Width d1 of second conductive line 220a may be measured from a side surface of second interlayer insulator pattern 210a to the outer side surface of second conductive line 220a. In particular, width "d1" of second conductive line 220a subsumes width "d2" associated with the exposed portion of an upper surface of first conductive line 208. Height "h1" associated with second conductive line 220a subsumes the depth of the recess associated with first interlayer insulator 204, the height of the side surface of the first conductive line 208, and the height of the side surface of second interlayer insulator pattern 210a.

The inclination angle characterizing second conductive line 220a may be similarly defined as described above in relation to second conductive line 120a, and preferably ranges between about 40° to 80°. With this shape and characteristics, second conductive line 220a enjoys strong adhesive capabilities as noted above.

Referring to FIG. 12, first recess region 236 containing a scribe line (SL) is formed using the first etching process described above and is initially formed with the same features as first recess region 136. However, the second etching process subsequently applied to the semiconductor wafer to expose a bonding pad is applied in such a manner that a second recess region 238 is formed in first interlayer insulator 204 with relation to first recess region 236. Second recess region 238 more shallow than first recess region, but with a larger width. That is, additional portions of first interlayer insulator 204 and first protective layer pattern 230a are removed by the second etching process to form second recess region 238.

Referring to FIG. 13, second protective layer 240 covers first protecting layer pattern 230a, second recess region 238, and at least some portion of first recess region 236. That is, second protective layer 240 covers upper and side surfaces of first protective layer pattern 230a, bottom and side surfaces of second recess region 238, at least a side surface of first recess region 236. The portion of first recess region containing the scribe line (SL) is not covered by second protective layer 240 but remains exposed. Second protective layer 240 may be formed, for example, by spin coating, and may thereafter be hardened using a predetermined heat treatment.

According to the present embodiment, second protective layer 240 sufficiently protects the underlying multi-layer structure from the ambient environment and impact stress. In particular, second protective layer 240 more strongly adheres at its bottom surface to the tiered sidewall profile formed by first recess region 236 and second recess region 238, as compared with even the foregoing embodiment. This characteristic further increases the protection afforded by second protecting layer 240. Of further benefit, first recess region 236 and second recess region 238 may be formed using a conventional etching process already required to expose a bonding pad after forming a fuse window in the overall device. In addition, the size of a semiconductor die in not increased by this remedy to lifting and coverage problems associated with conventional protective layers.

As noted above, second protecting layer 240 may be formed, for example, from a thermosetting polymer resin or a photosensitive polyimide resin to a thickness ranging from 2 µm to 20 µm.

Figure 14:
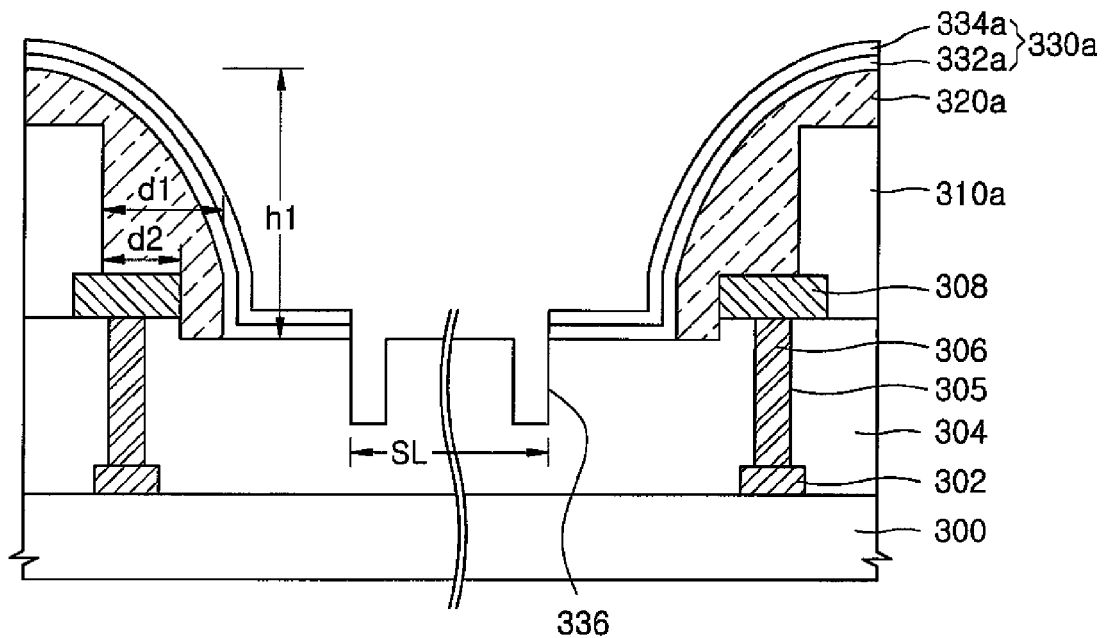
FIGS. 14 and 15 are sectional-views illustrating a semiconductor die with an improved protective layer and a related method of manufacturing a semiconductor wafer according to yet another embodiment of the invention.
Figure 15:
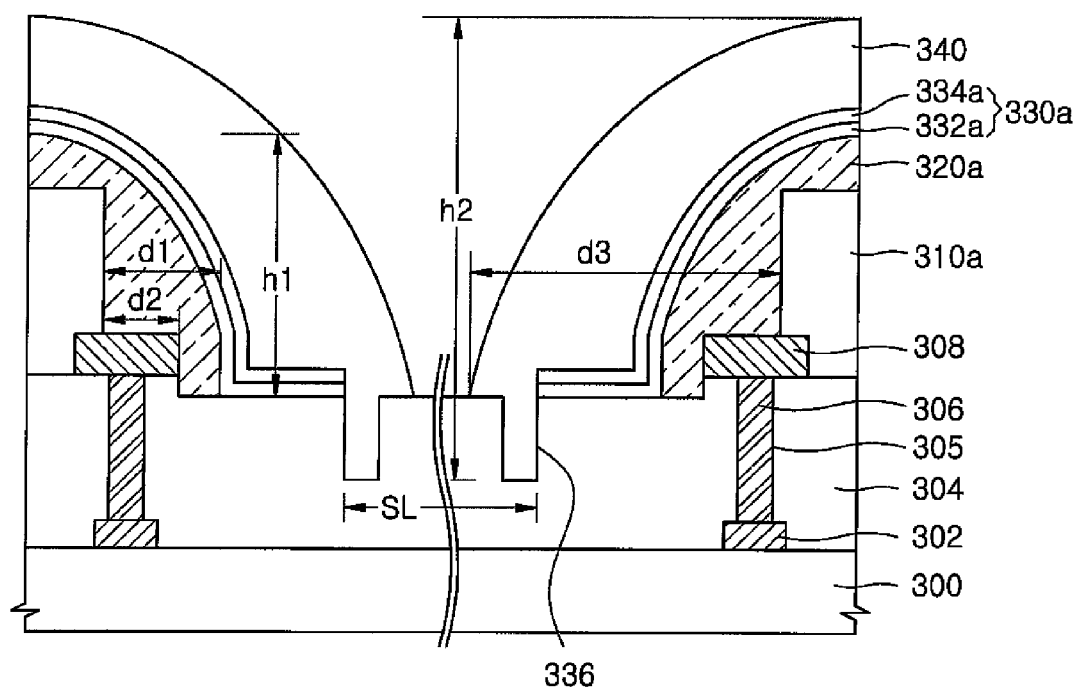

FIGS. 14 and 15 are sectional-views illustrating a method of manufacturing a semiconductor wafer with an improved step coverage according to a yet another embodiment of the invention. In this embodiment, the processing steps associated with the formation of first protective layer pattern 330a on second conductive line 320a and an upper surface portion of first interlayer insulator 304 are assumed to be identical to those described in the foregoing example in relation to analogous layers, components and/or elements.

The inclination angle characterizing second conductive line 320a may be similarly defined as described above in relation to second conductive line 120a, and preferably ranges between about 40° to 80°. With this shape and characteristic, second conductive line 320a enjoys strong adhesive capabilities as noted above.

Referring to FIG. 14, a scribe line (SL) is associated with a plurality of third recess regions 336 formed in the same manner as that described above. That is, the first etching process is performed to form a fuse window and then the second etching process is performed to expose a bonding pad. Therefore, a plurality of third recess regions 336 is formed in relation to a scribe line (SL).

Referring to FIG. 15, second protective layer 340 covers first protective layer pattern 330a and third recess regions 336. That is, second protective layer 340 covers upper and side surfaces of first protective layer pattern 330a and fills the third recess regions 336. A portion of the recessed upper surface of first interlayer insulator 304 adjacent to the plurality of third recess regions 336 contains the scribe line (SL) which remains uncovered by second protective layer 340. Second protective layer 340 may be formed using a spin coating technique, and may be subsequently hardened using a predetermined heat treatment.

According to the present embodiment, the second protective layer 340 sufficiently protects the underlying multi-layer structure from the ambient environment and impact stress. In particular, second protective layer 340 fills the third recess regions 336 formed around scribe line (SL) such that second protecting layer 340 strongly adheres to the underlying surfaces. Therefore, protection afforded by second protective layer 340 is much improved as compared with even the former embodiments described above. Further, the third recess regions 336 may be formed using a conventional etching process already applied to the formation of the overall device in the formation of fuse window and the exposure of a bonding pad. In addition, the size of a semiconductor dies according to the present embodiment is similar to the size of a conventional semiconductor chip As previously noted, second protective layer 340 may formed, for example, from a thermosetting polymer resin or a photosensitive polyimide resin having a thickness that ranges from 2 µm to 20 µm.

The foregoing embodiments illustrate various methods, techniques, and approaches to the manufacture of a semiconductor die (or alternately expressed the processing of a semiconductor wafer having many dies thereon) incorporating a protective layer or sequence of protective layers having improved step coverage, more uniform thickness, and better adhesion characteristics to related surfaces. In one aspect, the inclined surface (e.g., an arced incline) of the protective layer(s) facilitates these benefits. Because the protective layer(s) provide improved step coverage, more uniform thickness, and better adhesion characteristics, it provides better protection to underlying multi-layer structures.

Further, provision of this improved protective layer need not require significant additional processing steps. Rather, the recess region(s) associated with the improved protective layer are often conventionally required for other purposes, such as forming a fuse window or exposing a bonding pad.

Of note, the benefits provided by embodiments of the invention do not require an increase in the overall size of the semiconductor die.

While the invention has been particularly shown and described with reference to exemplary embodiments, it will be understood by those of ordinary skill in the art that various changes in form and details may be made therein without departing from the scope of the invention which is defined by the following claims. For example, although the foregoing embodiments describe a metal interconnection layer formed on a side surface of a two-layer stack of interlayer insulating layer, the metal interconnection layer might alternately be formed on a side surface of a three-layer (or greater number of layers) stack. Similarly, although the foregoing embodiments describe two conductive lines, including a first conductive line and a second conductive line, additional conductive lines might be incorporated in the multi-layer structure being protected by the protective layer(s) described in the invention.

What is claimed is:

1. A method of forming dies on a semiconductor wafer, the method comprising:
    providing a semiconductor substrate structure comprising a wafer, wherein the semiconductor substrate structure has a principal surface;
    forming at least one multi-layer structure on the principal surface of the semiconductor substrate structure, wherein the multi-layer structure has an upper surface and a side surface that meet at an angle;
    creating a scribe line for the wafer by forming a recessed region of the semiconductor substrate structure adjacent to the side surface of the multi-layer structure, wherein the forming of the recessed region comprises forming a recess in the principal surface of the semiconductor substrate structure; and
    forming, in adherence with at least one surface of the recessed region that defines the recess, at least one protective layer covering the multi-layer structure and having an arcuate convex outer surface that covers the portion of the multi-layer structure where the upper surface of the multi-layer structure meets the side surface of the multi-layer structure at an angle
    wherein the forming of the at least one protective layer comprises forming a silicon oxide layer with a density plasma chemical vapor deposition process on the multi-layer structure, and forming a silicon nitride layer, and forming a second protective coating on the silicon nitride layer.

2. The method of claim 1, wherein the forming of the second protective layer comprises forming a thermosetting polymer resin layer, or a photosensitive polyimide resin layer.

3. A method forming dies on a semiconductor wafer, the method comprising:
- providing a semiconductor substrate structure comprising a wafer, wherein the semiconductor substrate structure has a principal surface;
- forming at least one multi-layer structure on the principal surface of the semiconductor substrate structure, wherein the multi-layer structure has an upper surface and a side surface that meet at an angle, and the forming of the multi-layer structure comprises forming a first conductive line on the principal surface of the semiconductor substrate structure, and forming an insulating layer on the first conductive line, the first conductive line being exposed by the insulating layer at the side portion of the multi-layer structure;
- creating a scribe line for the wafer by forming a recessed region of the semiconductor substrate structure adjacent to the side surface of the multi-layer structure, wherein the forming of the recessed region comprises forming a recess in the principal surface of the semiconductor substrate structure;
- forming, in adherence with at least one surface of the recessed region that defines the recess, at least one protective layer covering the multi-layer structure and having an arcuate convex outer surface that covers the portion of the multi-layer structure where the upper surface of the multi-layer structure meets the side surface of the multi-layer structure at an angle; and
- before the at least one protective layer is formed, forming a layer of conductive material on the multi-layer structure and which covers the exposed first conductive line, and anisotropically etching the layer of conductive material to form a second conductive line covering the side portion of the multi-layer structure.

* * * * *